United States Patent [19]

Hollman

[11] Patent Number: 4,607,220

[45] Date of Patent: Aug. 19, 1986

[54] METHOD AND APPARATUS FOR LOW TEMPERATURE TESTING OF ELECTRONIC COMPONENTS

[75] Inventor: Kenneth F. Hollman, Carson City, Nev.

[73] Assignee: The Micromanipulator Co., Inc., Carson City, Nev.

[21] Appl. No.: 607,693

[22] Filed: May 7, 1984

[51] Int. Cl.[4] ........................................... G01R 31/26
[52] U.S. Cl. .................................................. 324/158 F
[58] Field of Search ............. 324/158 F, 158 P, 158 R

[56] References Cited

U.S. PATENT DOCUMENTS 4,026,412  5/1977  Henson ....................... 324/158 F X

OTHER PUBLICATIONS

IBM Tech. Discl. Bull., Jameson, G., "Frost Free Cold Probe", vol. 13, No. 10, Mar. 1971, p. 3121.

Primary Examiner—Stewart J. Levy
Assistant Examiner—Stephen M. Baker
Attorney, Agent, or Firm—Fitch, Even, Tabin & Flannery

[57] ABSTRACT

Apparatus for testing electronic components, such as integrated circuit chips, at a depressed temperature. The apparatus includes mounting structure for holding the electronic component to be tested and a heating and cooling stage positioned in heat transfer relationship with the component. Disposed on the mounting structure is an open top reservoir surrounding the electronic component and extending thereabove for holding sufficient liquid fluorocarbon to cover the component. The apparatus also includes probe means comprising porbes for making contact at predetermined locations on the top surface of the component. The probes are movable between respective first positions in substantial vertical alignment with their corresponding locations, but above the the liquid level of the reservoir, and respective second positions making contact at their corresponding locations whereby the component can be heated to drive off water vapor and, after addition of the fluid, the component can be cooled and tested without the formation of ice thereon. A method of testing electronic components at depressed temperatures is also set forth.

1 Claim, 4 Drawing Figures

METHOD AND APPARATUS FOR LOW TEMPERATURE TESTING OF ELECTRONIC COMPONENTS

BACKGROUND OF THE INVENTION

The present invention relates to a method and apparatus for testing electronic circuitry and, more particularly, to a method and apparatus for testing electronic devices (such as integrated circuit chips) at depressed temperature.

There is a need to test electronic circuitry, such as integrated circuit chips, at very depressed temperatures to determine the suitability of such circuitry for use in equipment, e.g., satellites, used in space, or to identify the cause of failure of circuitry when used at low temperature. The low temperature testing requires removing the top of (delidding) the plastic housing encapsulating the actual integrated circuit chip to expose contact points therein, and then lowering the temperature. When the temperature is lowered under atmospheric conditions, condensation or frost can develop and accrete on the exposed surface of the integrated circuit chip, making meaningful testing of the circuit impossible because the characteristics of the various circuit paths are altered.

It was common heretofore in the low temperature testing of electronic circuitry to avoid the condensation and frost problem by placing substantially the entire test station used to hold and make contacts with circuit paths in the chip, in an environmental enclosure or dry box. The interior of the enclosure is purged by supplying it with a gas such as dry nitrogen to displace air carrying water vapor so that when the temperature of the circuitry is reduced by virtue of its heat exchange relationship with a hot/cold stage, there can be no condensation or frosting. While satisfactory, the use of such an enclosure is somewhat cumbersome and slow in that various objects, e.g., the probe tips for contacting the desired circuit paths in the chip, must be situated and moved using gloves having skirts which seal openings in a wall of the enclosure. The enclosure also takes up significant valuable laboratory counter space.

In other prior art low temperature testing apparatus, a microelectric chip is precisely held on a hot/cold stage through the use of vacuum. A transparent inverted nitrogen shroud cap encloses the stage, chip and probe tips and the arms which carry the tips. Dry nitrogen gas is bled into the cap to purge air to avoid condensation as the temperature is lowered. Thereafter, the probe tips are lowered into contact with the exposed surface of the integrated circuit. These tips are used to provide the input and the output for each circuit. For further information regarding this apparatus, which requires complex controls and is designed for automated testing, reference may be made to U.S. Pat. No. 3,710,251.

SUMMARY OF THE INVENTION

Among the several aspects of the present invention may be noted the provision of an improved method of low temperature testing of electronic components and apparatus for use in carrying it out. The new method precludes condensation or frost forming on the component as its temperature is lowered and avoids the use of cumbersome and expensive environmental enclosures which take up a great deal of space and are relatively slow in use. Additionally, the new method and apparatus allow the test probes to be positioned very close to contact points on the surface of the component and in vertical alignment therewith, but with the probes outside the dry environment as the component is cooled. The apparatus can be used with many components of existing test stations and has long service life, is reliable in use, and is simple and economical to manufacture. Other aspects and features of the present invention will be, in part, apparent and, in part, pointed out hereinafter in the following specification particularly when taken in conjunction with the accompanying drawings.

Briefly, apparatus of the present invention includes mounting structure for holding the electronic component to be tested and a heating and cooling stage positioned in heat transfer relationship with the component. An open top reservoir is disposed on the mounting structure surrounding the component and extending thereabove for holding sufficient liquid to cover the component. The apparatus also includes probe means comprising probes for making contact at predetermined locations on the top surface of the component with the probes being movable from outside the dry environment provided by the liquid to positions below the level of the liquid to contact the predetermined locations at the top surface of the component.

As a method of testing electronic components, the method includes the steps of disposing the component to be tested in a reservoir; heating the component sufficiently to remove moisture from it; introducing into the reservoir sufficient electrically insulative liquid to cover the component to form a dry environment for the component; cooling the component to a temperature to approximate the most severe operating condition of the component; moving the probes to make contact at predetermined locations on a surface of the component; energizing the component while it is in its cooled state with the test probes in contact therewith; and monitoring the performance of the component while so energized by use of the test probes.

DESCRIPTION OF THE PREFERRED EMBODIMENT

Figure 1:
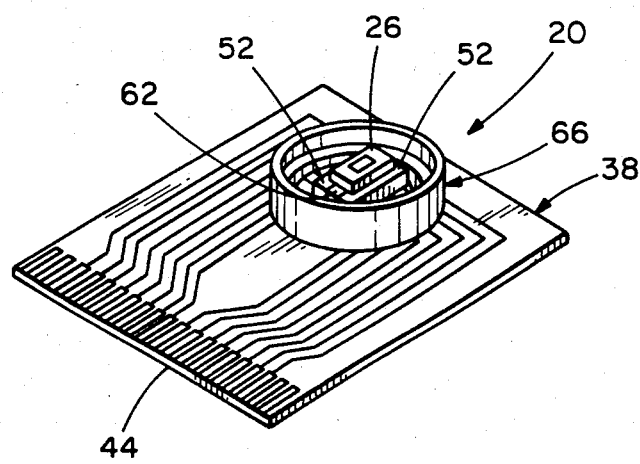
FIG. 1 is a perspective view of low temperature probing attachment of the present invention illustrating a mounted uncovered semiconductor device to be tested.
Figure 2:
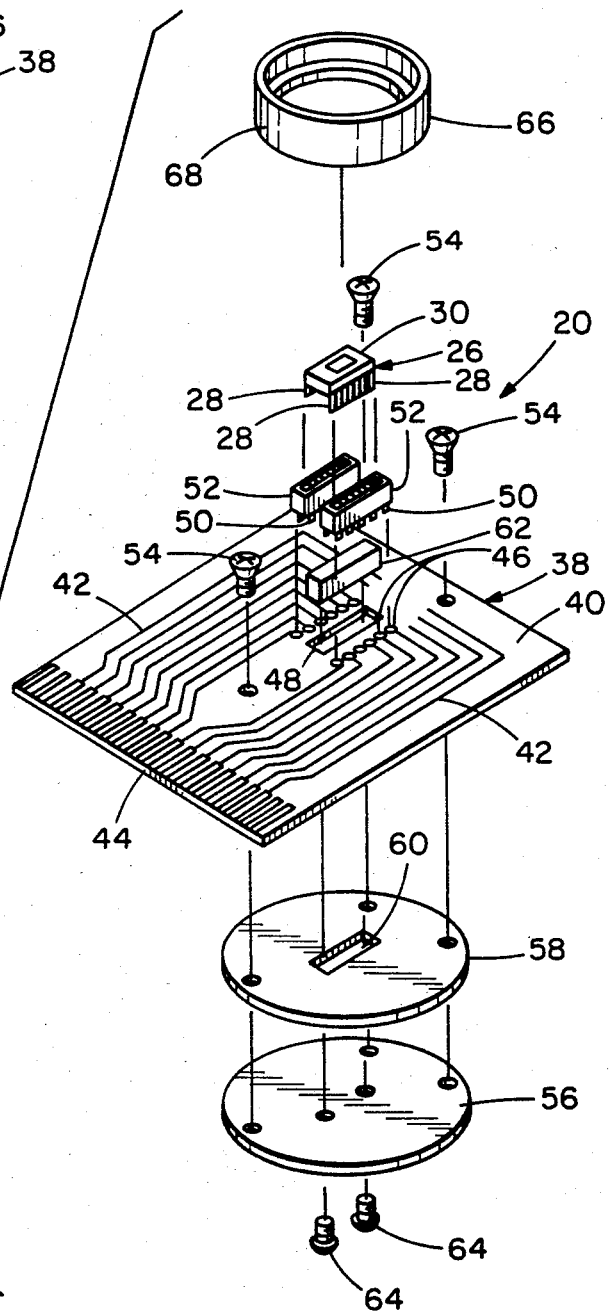
FIG. 2 is an exploded perspective view showing the various components of the low temperature probing attachment of FIG. 1.
Figure 3:
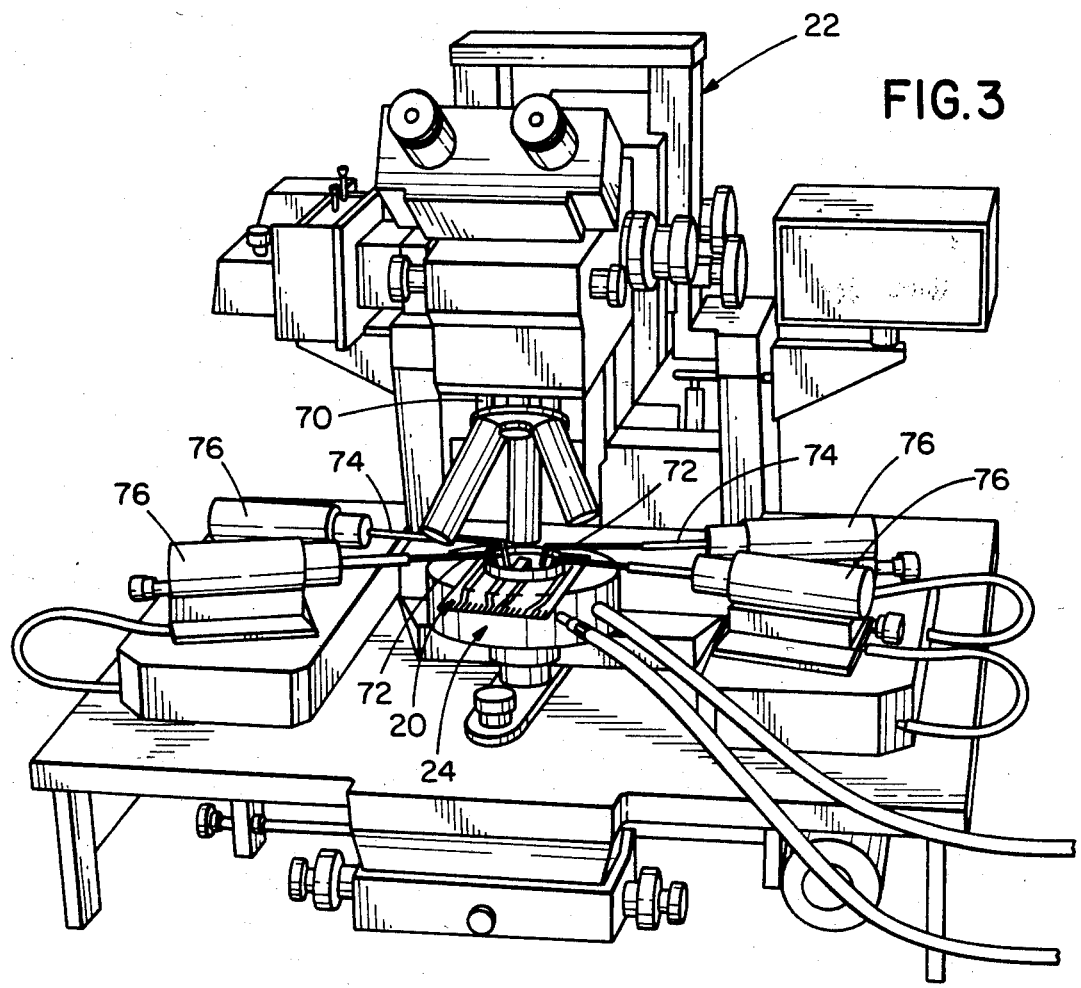
FIG. 3 is a perspective view of a test station, including a hot/cold stage, for use with the attachment of FIG. 1 for testing the delidded semiconductor device.

Referring now to the drawings, a low temperature probing attachment for use in testing electronic components, such as integrated circuit chips, at depressed temperatures is generally indicated in FIGS. 1 and 2 by reference character 20. As shown in FIG. 3, attachment 20 is adapted for use at a test station 22 and is mounted on a hot/cold stage 24. The stage 24 can have its temperature varied over a wide range, e.g., from −65° C. (near the temperature at which nitrogen boils) to +150°

C., while the test station includes microscope means for precisely aligning test probes with points of the surface of the electronic component to monitor the performance of the component. An example of such test station is Model 7000 and an example of a hot/cold stage is Model HCSM, both manufactured by The Micromanipulator Company of Carson City, Nev.

More specifically, and again referring to FIGS. 1 and 2, attachment 20 is shown supporting an integrated circuit chip 26 having a plurality of dependent conductive legs or terminals 28 arranged in two rows, commonly referred to as a dual in-line package. The chip 26 also has an insulative housing 30 the top of which has been removed (delidded) to expose contact points 32 and conductive paths 34 on the top surface 36 of the chip, as shown greatly enlarged in FIG. 4. The attachment 20 comprises a printed circuit board 38 carrying on its top surface 40 a plurality of conductive metallic strips 42 running from an edge 44 of the board to a plurality of apertures 46 arranged in two rows flanking a rectangular window 48. The apertures 46 receive the dependent pin portions of terminals 50 of a pair of in-line connector sockets 52 with the female upper portions of the socket terminals receiving corresponding terminals 28 of the integrated circuit chip 26. Such connector sockets are well known to those of skill in the art, and they need not be further described here. Suffice it to say that after the apertures are closed by soldering or by spring closure, the dependent socket terminal portions to corresponding metallic strips 42 on the printed circuit board 38, electrical connections can be made with the integrated circuit chip to energize it from the edge 44 of the printed circuit board.

Attached to the bottom surface of the printed circuit board by threaded fasteners 54 are a generally circular base plate 56 made of a material, such as aluminum, having good heat transfer characteristics; and a generally circular thermally and electrically insulative intermediate plate 58 made of a material such as fiberglass. The intermediate plate 58 is provided with a rectangular opening 60 aligned with the window 48 of the printed circuit board 38. A metallic block 62, preferably made of aluminum, is mounted on the base plate 56 by threaded fasteners 64 and extends through the opening 60 and the window 48 into engagement with the base of the encapsulated integrated circuit chip 26 to establish a good heat transfer relationship between the hot/cold stage 24 and the chip. Although not shown, it will be understood that sealing means are used about the block 62 where it extends though the window of the printed circuit board to close the aperture to the passage of fluid. This sealing may be provided through the use of an O-ring made of natural rubber, neoprene or Teflon (a registered trademark of E. I. du Pont de Nemours and Co., for synthetic fluorine-containing resins), or the window could be sealed through the use of a low temperature epoxy.

Disposed of the top surface 40 of the printed circuit board 38 surrounding the mounted chip 26 is an open top reservoir 66 having a side wall 68 extending above the level of the chip. The reservoir may be glued to the top surface 40 using a low temperature epoxy, or it may be otherwise mounted so that a seal is established between the reservoir and the board which is impervious to the passage of liquid. The reservoir is used to retain sufficient liquid fluorocarbon to submerge the chip after the temperature of the chip has been raised sufficiently to drive off moisture. Examples of suitable liquid fluorocarbons are part numbers FC, 84, 75, 77 and 40, available from the 3M Company.

Figure 4:
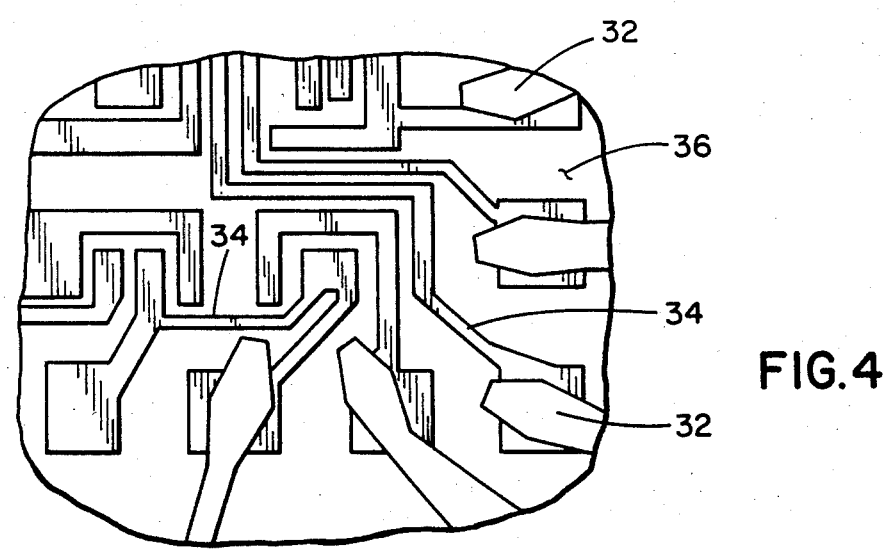
FIG. 4 is an enlarged plan showing a portion of the top surface of the delidded semiconductor device of FIG. 1.

The hot/cold stage 24 has passageways extending to its upper surface so that the attachment 20 can be firmly mounted thereon by pulling a vacuum on the bottom surface of the base plate. The test station includes high magnification optics in the form of a multi-lens microscope 70 to enable the operator to very precisely vertically align the probe tips 72 mounted on the arms 74, the positioning of which is controlled by micropositions or manipulators 76. Referring to FIG. 4, very precise alignment with contact points on the top surface of the chip is required. It will be appreciated that FIG. 4 is greatly enlarged and some of the very small circuit paths, which may have a width comparable to that of a human hair, are not shown in the interest of preserving clarity.

Operation of the low temperature probing attachment 20 of the present invention is as follows: After the attachment 20 is securely mounted on the hot/cold stage 24 by pulling a vacuum on the base of the attachment, the various probe tips 72 are very carefully vertically aligned with desired contact points on the top surface of the integrated circuit chip 26, which has had the top of its insulative housing 30 removed. The tips are positioned very closely adjacent to their desired contact points, perhaps within a few thousandths of an inch. The hot/cold stage 24 is caused to be heated by its controller with the integrated circuit chip 26 warmed through its heat transfer relationship with the hot/cold stage via the base plate 56 and the metallic block 62. The integrated circuit device is preferably heated to about 70° C. or above to drive off any moisture attached to the device surface. The device preferably is held at this temperature for at least five minutes. The reservoir 66 is filled with a sufficient amount of the liquid fluorocarbine to completely cover the integrated circuit chip 26. Next the integrated circuit chip is cooled by the hot/cold stage 24 to the required depressed temperature and sufficient time is allowed for equilibrium to be reached in the device. As the liquid has good electrically insulative characteristics, it will not function to short circuit any electrical paths.

The liquid functions to encapsulate the integrated circuit chip under test in a dry environment so that as the temperature is decreased, after the moisture attached to the surface of the chip has been driven off, there will be no formation of condensation or accretion of frost on the device. It will be appreciated that if such condensation or frosting were to occur, meaningful testing of the device would be impossible because the electrical characteristics of the circuitry to be tested would be unpredictably altered. After the proper depressed temperature has been reached and after sufficient time has elapsed for equilibrium to occur, the integrated circuit chip is energized through the printed circuit board strips 42 and the manipulators 76 are actuated causing the arms 74 to drop the probe tips 72, which had been maintained outside the dry environment, into the liquid to monitor the performance of the chip 26. It will be appreciated that the probes do not have to supply the input and the output for each circuit path to be tested because the chip circuits are in electrical contact with the edge 44 of the printed circuit board 38. Therefore, testing is simplified because it is much easier to complete a circuit through the use of the strips 42 extending to the edge 44 of the board 38 than to use a separate manipulator, which must be precisely aligned, for each input/output. After completion of the testing to determine the response to energization of the circuits in the integrated circuit chip or otherwise to analyze the response of such circuits to the energization, the probe tips can be raised by the manipulators. The liquid is poured or drained off, and the integrated circuit chip 26 under test is lifted from the sockets 52 and its lid replaced to ready it for placement into service under low temperature conditions.

In sharp contrast with the prior art, the volume of the dry environment, surrounding the chip, wafer, or other electronic component under test, is very small, not a great deal larger than the volume of the device itself under test. Previously, a dry environment of much larger volume was required, as in the use of a dry environmental enclosure, which was somewhat cumbersome in use and occupied a great deal of valuable laboratory counter space. It will also be noted that since the dry environment is provided by a liquid, no lid for the reservoir is required. This has the advantage that the probe tips can be positioned very close to but outside of the dry environment and that they can easily enter the dry environment after the device has been cooled to a sufficiently depressed temperature without the accretion of frost. This feature makes it much easier for the operator to align and contact the probes at their desired location on the exposed top surface of the device under test.

As a method of testing electronic components, the present invention comprises several steps:

(A) The lid of the housing of the component to be tested is removed to expose contact points on a surface of the device.

(B) The component is disposed in a reservoir.

(C) The component is heated sufficiently to remove moisture from it.

(D) Sufficient electrically insulative liquid to cover the component is introduced into the reservoir to form a dry environment for the component.

(E) The probes are positioned adjacent to and in substantially vertical alignment with points on the surface of the component to be engaged.

(F) The component is cooled to a temperature to approximate its most severe operating condition.

(G) The test probes are moved to make contact with the predetermined points.

(H) The component is energized while it is in its cooled state with the test probes in contact therewith.

(I) And the performance of the component while so energized is monitored by use of the test probes.

In view of the above, it will be seen that the several objects of the invention are achieved and other advantageous results attained.

As various changes could be made without departing from the scope of the invention, it is intended that all matter contained in the above description shall be interpreted as illustrative and not in a limiting sense.

What is claimed is:

1. An attachment for being mounted on a hot/cold stage at an electronic component test station for use in testing an integrated circuit chip of the dual in-line package type having two rows of dependent conductive legs extending from a chip body, said stage being adapted to firmly mount an attachment placed thereon by pulling a vacuum, said attachment comprising:

a printed circuit board having a plurality of conductive strips and two rows of spaced apertures, said strips and apertures corresponding in number with one strip terminating at each aperture;

a pair of spaced, substantially parallel in-line connector sockets each having a series of terminal elements including dependent pin portions with each pin portion electrically connected to a corresponding conductive strip by means of being soldered in the aperture corresponding to that strip, each of said sockets releasably receiving one of the rows of said legs of said circuit chip so that the chip body is elevated with respect to said printed circuit board and bridges said sockets;

an open top reservoir disposed and held on said printed circuit board surrounding and containing said chip and extending thereabove for holding sufficient liquid to cover said chip;

a base plate made of a material having good heat transfer characteristics and having a substantially closed base surface for application of said vacuum to mount said attachment on said stage;

a thermally and electrically insulative intermediate plate disposed between said base plate and said printed circuit board, said board having a window disposed between but extending short of said two rows of apertures, said intermediate plate having an opening aligned with said window;

a metallic block disposed in its entirety between said base plate and said chip body and concurrently engaging said base plate and said chip body, said block extending through said intermediate plate opening and said printed circuit board window; and attachment means holding said printed circuit board and said base plate so that said attachment is removable as a unit from said stage.

* * * * *